United States Patent [19]

Carpentier

[11] Patent Number: 4,684,899
[45] Date of Patent: Aug. 4, 1987

[54] AUDIO AMPLIFIER FOR A MOTOR VEHICLE

[76] Inventor: Claude Carpentier, 163 Rue Armand Silvestre, 92400 Courbevoie, France

[21] Appl. No.: 826,800

[22] Filed: Feb. 6, 1986

[30] Foreign Application Priority Data

Feb. 11, 1985 [FR] France ................. 85 01904

[51] Int. Cl.⁴ .............................. H03G 3/20
[52] U.S. Cl. .................... 330/149; 330/129; 330/279; 330/304; 455/233; 455/238
[58] Field of Search ........... 330/129, 149, 279, 304; 455/238, 233; 381/86, 94, 95, 107

[56] References Cited

U.S. PATENT DOCUMENTS 4,380,824  4/1983  Inoue ................... 455/238 X

FOREIGN PATENT DOCUMENTS 2801734  7/1979  Fed. Rep. of Germany ...... 330/129
 898796  5/1945  France .
2514213  4/1983  France .

*Primary Examiner*—James B. Mullins
*Attorney, Agent, or Firm*—Owen, Wickersham & Erickson

[57] ABSTRACT

Low frequency amplifier, mainly for use in motor vehicles, of the type comprising an equalizing device and a device for compensating ambient noise, characterized in that the equalizing device (1a) is a fixed-correction-type device placed downstream of the controlled-gain amplifier (2) having the task of compensating the ambient noise.

2 Claims, 3 Drawing Figures

AUDIO AMPLIFIER FOR A MOTOR VEHICLE

The invention relates to sound reproduction in a motor vehicle.

BACKGROUND OF THE INVENTION

Sound reproduction in a motor vehicle presents a certain number of specific problems. Those of these problems which belong to the electro-acoustic domain can be classified in two categories: on the one hand, those of an ambient noise type and, on the other hand, those associated with the sound balance. In all the known devices for sound reproduction, these two problems are dealt with independently of one another.

The state of the art relating to the compensation of sound volume as a function of the ambient noise can be illustrated by French Patents Nos. 2,435,879, 2,466,901, 2,513,839 and 2,529,727.

The state of the art relating to the sound balance is much less extensive and can be illustrated by French Patent No. 2,514,213 in the name of the Applicant.

FIG. 1 shows the basic diagram of a device which is commercially available under the name "S-TRONIC MK3" and which represents the most sophisticated state of the art with respect to an amplifier for a motor vehicle.

The signal input E is followed first by an equalizer 1, followed by a controlled-gain amplifier 2 which, in turn, is followed by a power amplifier 3 feeding a loudspeaker 4. The equalizer 1 comprises a control device 5 including a certain number of preset potentiometers. The controlled-gain amplifier 2, for its part, is controlled by a circut 6 which produces a control voltage from respective signal levels originating, on the one hand, from an ambient-noise microphone 7 and, on the other hand, from the modulation taken downstream of the controlled-gain amplifer 2 across a preset potentiometer 8.

The different automatic volume control devices differ essentially in the configuration of the circuit 6 which may be more or less complex in order to account for various parameters.

However, whatever the configuration of the circuit 6, a basic function must always be provided and this is used to estimate the level of the ambient noise. This estimation is effected by comparing the respective levels of signals produced by the microphone 7 and consisting of noise produced by the vehicle and of the signal produced by the loudspeaker, and of the pick-up 8 containing only the signal. This estimation is made with a dB error given by the formula:

$$dB = dS \times S/B$$

in which dS is the non-linearity error of the electroacoustical chain from local loudspeaker to microphone, and S/B is the ratio between useful signal and ambient noise.

The invention has the objective of implementing an audio amplifier for a motor vehicle, which amplifier eliminates the preceding disadvantages by providing simultaneous automatic control of volume and sound balance in an efficient manner and without multiple and delicate control systems.

SUMMARY OF THE INVENTION

The basic idea of the present invention is as follows: if a sufficiently linear microphone is placed in the proximity of the head of the listener, the equalization curve necessary to ensure good listening sound balance is the same as that necessary to ensure that the dS error is low. Now, on the one hand, there are quite inexpensive and very linear electret microphones and, on the other hand, the area close to the listener can be selected for a microphone having the task of picking up the ambient noise.

The invention consists in utilizing a fixed-correction equalizer and of placing it downstream of the controlled-gain amplifier and of the signal pick-up point. It also consists in utilizing a microphone having a known response curve and in placing it preferably in the proximity of the head of the listener, although other locations may be suitable such as, for example, the front face of car radios.

In this case, experience has in fact, shown that a very acceptable compromise between the sound quality and the compensation of the ambient noise is always obtained for controlling the equalizer. This result, which is somewhat surprising, arises from the fact that the acoustic pressure is uniformly distributed within the passenger compartment at the main resonant frequency of the vehicle which causes the most disturbance to the sound stability and balance. On the other hand, the irregularities originating from the loudspeakers themselves are also found throughout the passenger compartment.

This possibility of obtaining quite satisfactory results by placing the microphone on the front face of the car radio is of particular interest due to the simplification which this brings about. The only disadvantage of this configuration is the distance between the microphone and the driver's window, resulting in a loss in the ratio between useful signal and ambient noise when the window is open because the driver's head is then more exposed to the noise than is the microphone.

Other features of the invention will appear in the following description of embodiments, taken by way of example.

DESCRIPTION OF SOME PREFERRED EMBODIMENTS

Figure 1:
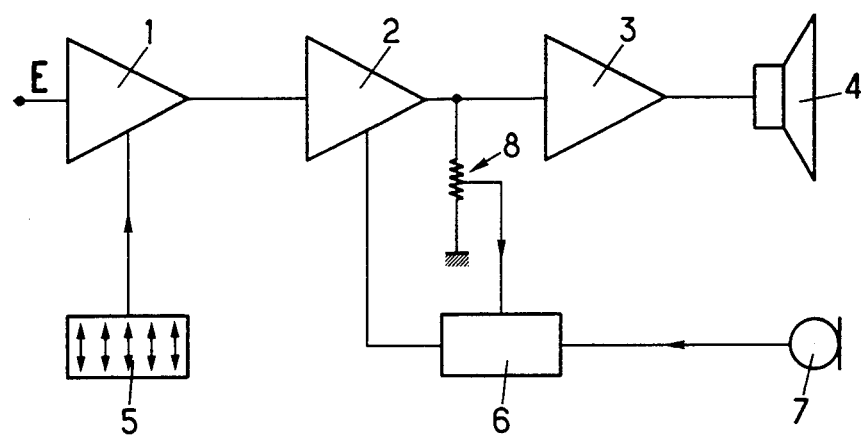
FIG. 1 is a circuit diagram of a prior-art device.

As previously explained, according to the state of the art represented by FIG. 1, the equalizer 1 must be placed upstream of the controlled-gain amplifier 2 because, if it were placed downstream, any manipulation by the user of the preset potentiometers of the control device 5 of the equalizer would negate the control of the signal pick-up potentionmeter 8 and result in instability of the device for compensating the ambient noise.

Figure 2:
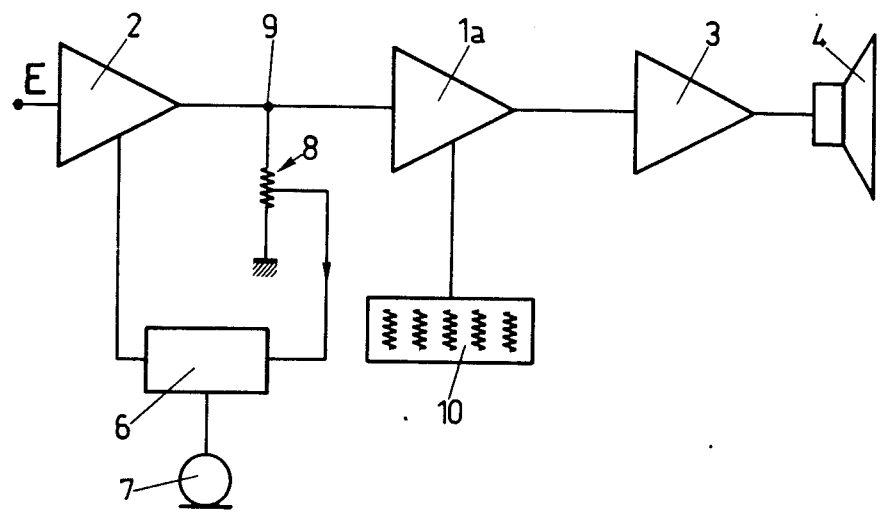
FIG. 2 is a circuit diagram of one embodiment of the present invention.

In contrast, according to the invention and as is apparent from FIG. 2, a fixed-correction-type equalizer 1a is used, for example of the type described in French Patent No. 2,514,213 in the name of the Applicant, and is placed downstream of the controlled-gain amplifer 2 and of the signal-pick-up point 9.

If the equalizer 1a supplies the inverse curve of the curve obtained without the equalizer in the region of the microphone 7, the error dS will be zero and the sound balance accurately controlled.

Figure 3:
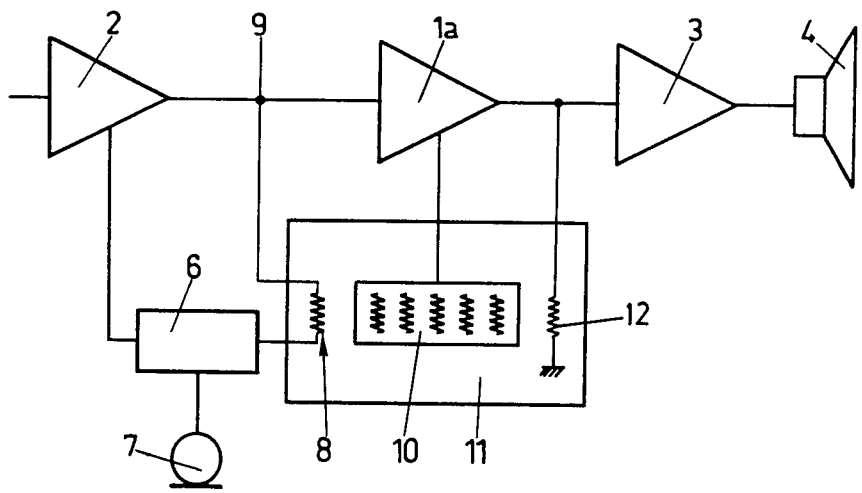
FIG. 3 is a similar diagram of another embodiment of the invention.

By way of improvement, so that the amplifier according to the invention can be adapted to multiple configurations, the equalizer control means 10 and the ambient noise compensation device control means 8 are combined on a removable card 11 as shown in FIG. 3.

Moreover, trial of the device according to the invention has shown that one control facility currently available to the user should be taken away from him: this is the control of the ratio of the volume between the front speakers and the rear speakers, more commonly called FADER in the case of four-channel amplifiers. In effect, the measurements show that changing the setting of the front/back ratio has a considerable influence on the low frequency response. It is therefore also advantageous to preset the optimum levels of this ratio, which can also be done with the aid of supplementary fixed resistors 12 on the card 11 previously indicated.

I claim:

1. Low frequency amplifier, mainly for use in motor vehicles, comprising an equalizing device and means for compensating ambient noise, said means including an ambient-noise microphone, a controlled-gain amplifier controlled by a control voltage and having an outlet with a signal pickup point, and a control circuit for generating said control voltage and having a first input connected to said ambient-noise microphone and a second input connected to said signal pick-up, said equalizing device being a fixed-correction-type device, preset by fixed electronic components, downstream of said signal pick-up point.

2. Amplifier according to claim 1, wherein said device for compensating ambient noise is preset by second fixed electronic components, said first-named and said second fixed electronic components being combined on a support which is removable and interchangeable so that it can be adapted beforehand to particular predetermined configuration.

* * * * *